(12) United States Patent
McAdams (10) Patent No.: US 6,275,084 B1
(45) Date of Patent: Aug. 14, 2001

(54) PHASE MODULATED INPUT/OUTPUT CIRCUIT

(75) Inventor: Hugh P. McAdams, McKinney, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/330,469

(22) Filed: Jun. 10, 1999

Related U.S. Application Data (60) Provisional application No. 60/089,558, filed on Jun. 17, 1998.

(51) Int. Cl.[7] .................................................. H03K 11/16
(52) U.S. Cl. ......................... 327/239; 327/245; 365/233
(58) Field of Search .................................. 327/233, 234, 327/235, 236, 237, 239, 243, 244, 245, 2, 3, 7, 8, 269; 365/198, 230.01, 230.05, 230.06, 230.08, 233, 233.05

(56) References Cited

U.S. PATENT DOCUMENTS

| | | | |
|---|---|---|---|
| 4,589,099 | * 5/1986 | Laffitte et al. | 365/230.2 |
| 5,321,369 | * 6/1994 | Wolaver | 327/259 |
| 5,486,783 | * 1/1996 | Baumert et al. | 327/149 |
| 5,886,946 | * 3/1999 | Ooishi | 365/233 |
| 5,995,441 | * 11/1999 | Kato et al. | 365/233 |

OTHER PUBLICATIONS

"A CMOS 160Mb/s Phase Modulation I/O Interface Circuit", Nogami, et al., ISSCC94, Session 6, Clock and Data Recovery, Paper TA 6.1, Digest of Technical Papers, 2 sheets, 1994.

* cited by examiner

Primary Examiner—Timothy P. Callahan
Assistant Examiner—An T. Luu
(74) Attorney, Agent, or Firm—Robert N. Rountree; W. James Brady, III; Frederick J. Telecky, Jr.

(57) ABSTRACT

A circuit is designed with a delay circuit (300,301,500) coupled to receive a bias (256) and a reference signal (242). The delay circuit produces a series of phase signals (214). The phase signals are spaced apart in time in response to the bias. Each phase signal has a respective time after the reference signal. Each phase corresponds to logic states of a plurality of data signals. An encoder circuit (900,1100) is coupled to receive a first phase signal and a first plurality of data signals (212). The encoder circuit produces a first encoded data signal (220) at a time corresponding to the respective time of the first phase signal. A decoder circuit (600,800) is coupled to receive a second phase signal and a second encoded data signal (220) corresponding to the respective time of the second phase signal. The decoder circuit produces a second plurality of data signals (212) corresponding to the second phase signal.

25 Claims, 9 Drawing Sheets

PHASE MODULATED INPUT/OUTPUT CIRCUIT

This application claims priority under 35 USC § 119(e)(1) of provisional application number 60/089,558, filed Jun. 17, 1998.

FIELD OF THE INVENTION

This invention relates to an integrated circuit and more particularly to an integrated circuit with phase modulated input and output circuits.

BACKGROUND OF THE INVENTION

Present complementary metal oxide semiconductor (CMOS) synchronous dynamic random access memory (SDRAM) circuits are frequently used for main memory in a variety of applications including desk top and portable computer systems. Advances in system technology require ever increasing clock rates and memory bus widths to achieve high data rates. Both of these methods, however, are subject to practical limitations. Increased clock rates increase system cost due to a need to reduce parasitic loading. Increased memory bus widths fulrther increase system cost by increasing memory package pin counts, thereby increasing memory package size and a required number of printed circuit board traces.

A proposed solution to these problems was presented by K. Nogami & A. El Gamal, A CMOS 160 Mb/s Phase Modulation I/O Interface Circuit, ISSCC Digest of Technical Papers, February 1994 at 108. Nogami et al. present a circuit for transmitting and receiving multiple data bits over each input/output (I/O) pin in a single clock cycle. Each clock cycle is divided into $2^N$ phases or respective time slots. A logic state of each of N data bits corresponding to a single I/O pin, determines the respective time slot during which a data signal is transmitted or received. Thus, multiple data bits are phase modulated and simultaneously transmitted or received during a single clock cycle.

Nogami et al. use a voltage controlled oscillator (VCO) and phase locked loop (PLL) circuit to maintain stable phase positions with variations in temperature, supply voltage and the manufacturing process. The VCO and PLL circuits, however, increase circuit complexity and power consumption. Moreover, Nogamni et al. require a periodic reference cycle within data cycles compensate for VCO frequency drift. This periodic reference cycle interrupts data transmission and imposes an additional task on the system processor or memory controller. Finally, Nogami et al. require synchronization with a system clock. This imposes a significant limitation on large circuits such as memory systems, since propagation delay of the system clock may be substantially different from a propagation delay along an I/O bus.

SUMMARY OF THE INVENTION

These problems are resolved by a circuit comprising a delay circuit coupled to receive a clock signal having a period and a reference signal. The delay circuit produces a series of phase signals within a time no greater than the period. Each phase signal has a respective time with respect to the reference signal. A data circuit, responsive to a plurality of N data signals and at least one phase signal produces an output signal after the respective time of the at least one phase signal.

The present invention provides phase modulated I/O without VCO and PLL circuit complexity and power consumption. Multiple data bits are passed through each I/O terminal in a single clock cycle to increase the data rate.

BRIEF DESCRIPTION OF THE DRAWINGS

A more complete understanding of the invention may be gained by reading the subsequent detailed description with reference to the drawings wherein.

DETAILED DESCRIPTION OF THE PREFERRED EMBODIMENTS

Figure 1:
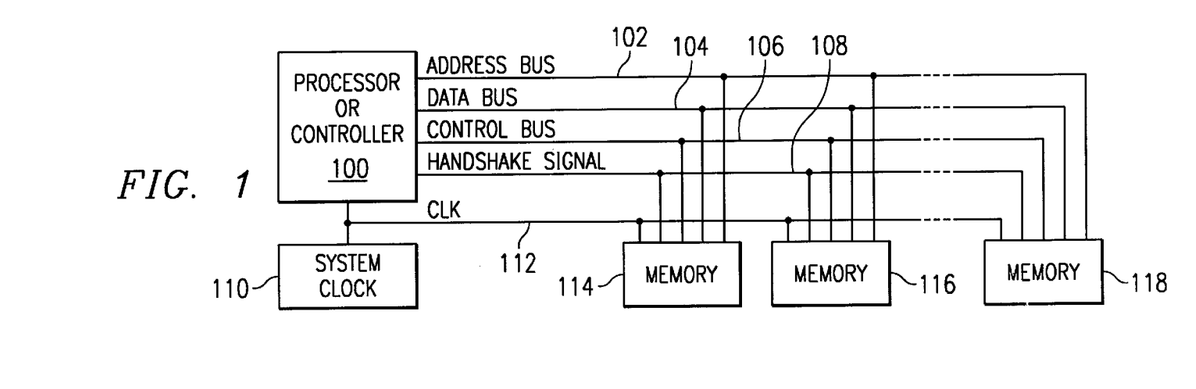
FIG. 1 is a block diagram of a memory system, that may employ phase modulated I/O according to the present invention.

Referring now to FIG. 1, there is a block diagram of a memory system that may employ phase modulated I/O according to the present invention. A processor of controller 100 communicates with individual memory circuits 114–118 via address bus 102, control bus 106 and handshake lead 108 to exchange data over data bus 104. The processor or controller and the individual memory circuits operate in synchronization with clock signal CLK on lead 112. Due to parasitic resistance, inductance and capacitance (RLC) of lead 112, however, clock signal CLK is applied to memory circuit 116 at a time after it is applied to memory circuit 114. Furthermore, clock signal CLK is applied to memory circuit 118 at a time after it is applied to memory circuit 116. These propagation delays of clock signal CLK may be negligible for small memory systems with small parasitic RLC values. For large memory systems operating at high clock frequencies, however, this propagation delay may be a substantial part of the period of clock signal CLK.

Processor 100 produces the handshake signal on lead 108 for a data store operation. The RLC parasitic values of lead 108 are similar to those of data bus 104. Thus, a phase relationship between the handshake signal and the data signal is maintained during the data store or write operation without regard to the relative placement of an individual memory circuit within the memory system. Moreover, the handshake signal on lead 108 is produced by an individual memory circuit 114–118 for a data load or read operation. The same phase relationship between the handshake signal and the data signal therefore, is maintained during the data load or read operation as well.

This handshake signal is highly advantageous to the operation of the memory systeml Both the processor 100 and individual memory circuits 114–118 have similar phase modulated I/O circuits for transmitting and receiving encoded data signals. Both the processor 100 and individual memory circuits 114–118 receive a handshake signal on lead 108 at a predetermined time immediately prior to receiving the encoded data signal on data bus 104. Since this predetermined time does not change with propagation delay, each receiving circuit has a precise indication of valid data on data bus 104 for either store or load operations. Furthermore, this precise indication of valid data provides a reference time for the receiving circuit to select one of several data phases within a single clock cycle.

Figure 2:
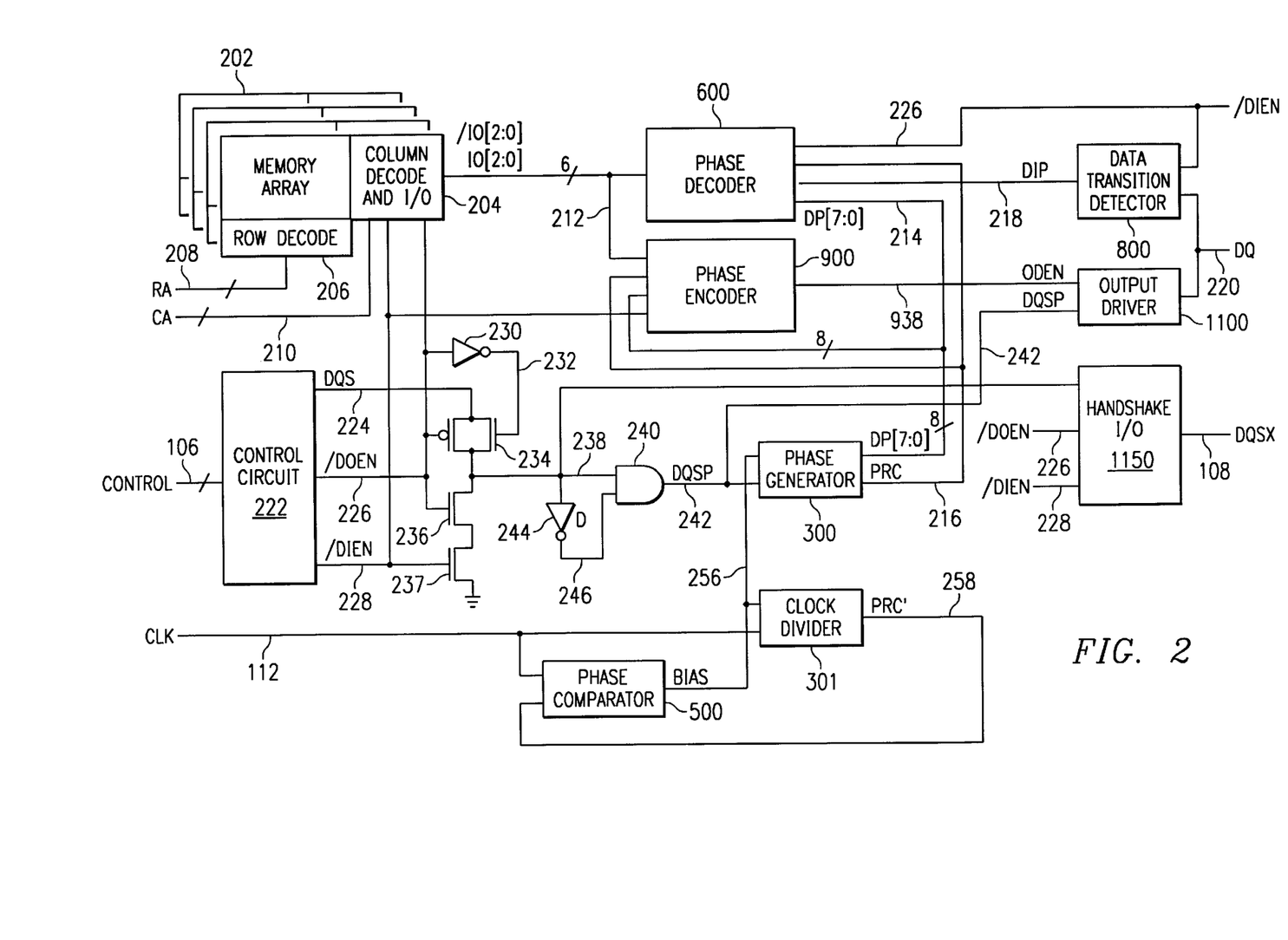
FIG. 2 is a schematic diagram of an embodiment of a memory device having a phase modulated I/O circuit of the present invention.

Referring now to FIG. 2, there is a schematic diagram of an embodiment of a simplified memory device having a phase modulated I/O circuit of the present invention. Individual memory cells within memory array 202 are selected by row decode circuit 206 and column decode and I/O circuit 204 in response to row address signal RA on bus 208 and column address CA on bus 210, respectively. Control circuit 222 is coupled to receive external control signals on bus 106 and generates logic signals for operation of the memory array and the phase modulated I/O circuit. A phase circuit, including phase generator circuit 300, clock divider circuit 301 and phase comparator circuit 500, is coupled to the control circuit via lead 242 and to clock signal CLK on lead 112. The phase circuit applies data phases DP[7:0] on bus 214 and precharge signal PRC on lead 216 to data input and output circuits. The data output circuit, including phase encoder circuit 900 and output driver circuit 1100, is coupled to memory array 202 via bus 212 and to data terminal 220. The data input circuit, including phase decoder circuit 600 and data transition detector circuit 800, is also coupled to memory array 202 via bus 212 and to data terminal 220.

During a memory read or load operation, control circuit 222 produces active low data output enable signal /DOEN on lead 226 in response to control signals on bus 106. Data input enable signal /DEN remains inactive high. Internal handshake signal DQS on lead 224 is developed by control circuit 222 (FIG. 2 and FIG. 13, Times 1 and 11) in synchronization with data signals IO[2:0] and /IO[2:0] on bus 212 from memory array 202. Active low data output enable signal /DOEN enables the read data path of column decode and I/O circuit 204 for producing data signals IO[2:0] and their respective complements /IO[2:0]. Active low data output enable signal /DOEN also turns on CMOS gate 234, thereby applying internal handshake signal DQS to lead 238. The handshake signal at lead 238 is applied to handshake I/O circuit 1150, which produces external handshake signal DQSX on lead 108. The low-to-high transition on lead 238 results in a logic high on both inputs of AND gate 240, causing handshake pulse signal DQSP to go high temporarily until delay inverter 244 and produces a low output on lead 246. This high level of handshake pulse signal DQSP initiates generation of a series of data phase signals DP[7:0] on bus 214. The voltage level of BIAS on lead 256 determines the time between each data phase signal. A phase comparator circuit 500 develops this BIAS level by comparing the phase of clock signal CLK with signal PRC' from clock divider circuit 301, as will be explained in detail.

Data phase signals DP[7:0] are applied to phase encoder circuit 900 in synchronization with data signals IO[2:0] and their respective complements /IO[2:0] to produce output data enable signal ODEN on lead 938 at a phase time corresponding to a logic state of the data signals. Output driver circuit 1100 receives data enable signal ODEN and produces encoded data signal DQ on lead 220. The read operation is concluded after the last phase signal is produced by phase generator 300, a time for a minimum encoded data pulse width has elapsed and precharge signal PRC on lead 216 precharges the phase modulated I/O circuit for the next memory access operation.

The handshake signal DQSX is highly advantageous for large memory systems. The memory integrated circuit produces handshake signal DQSX on lead 108 in synchronization with encoded data signal DQ on lead 220. Output transistors 1112 and 1118 (FIG. 11A) of output driver circuit 1100 are the same size and provide drive strength equal to output transistors 1162 and 1164 (FIG. 1B) of handshake I/O circuit 1150. Leads 108 and 220 (FIG. 2) are routed along a similar path having similar values of parasitic RLC. Thus, the phase relationship between handshake signal DQSX and encoded data signal DQ is always maintained without regard to the physical location of the memory circuit with respect to the processor. This precise phase relationship permits correct decoding of the encoded data signal in memory systems having significantly different bus lengths.

A memory write operation is similar to the previously described operation. Control circuit 222 holds data output enable signal /DOEN inactive high so that CMOS gate 234 remains off. Data input enable signal /DIEN on lead 228 goes active low, responsive to control signals on bus 106, to enable the write data path of column decode and I/O circuit 204, data transition detector circuit 800 and phase decoder circuit 600. Data input enable signal /DIEN also enables the input path of handshake I/O circuit 1150 for conducting external handshake signal DQSX on lead 108 to lead 238. The internal handshake signal on lead 238 is applied to AND gate 240. External handshake signal DQSX from a remote processor, therefore, produces handshake pulse signal DQSP on lead 242 (FIG. 12, times 1 and 11) in synchronization with encoded data signal DQ on lead 220. This handshake pulse signal DQSP initiates generation of a series of data phase signals DP[7:0]. A transition of the corresponding encoded data signal DQ from the remote processor causes data transition detector circuit 800 to produce a short-duration data input pulse DIP on lead 218.

Data phase signals DP[7:0] are applied to phase decoder circuit 600 in synchronization with data input pulse DIP to produce data signals IO[2:0] and their respective complements /IO[2:0]. These data signals are written to memory cells selected by row address signals RA on bus 208 and column address signals CA on bus 210 as is well known in the art. The write or store operation is concluded after the last phase signal and a time for a minimum encoded data pulse width have elapsed and precharge signal PRC on lead 216 precharges the phase modulated I/O circuit for the next operation.

When the memory circuit of FIG. 2 is inactive, control circuit 222 holds both data input enable /DIEN and data output enable /DOEN inactive high. Series connected N-channel transistors 236 and 237 remain on, thereby holding lead 238 low. Handshake I/O circuit 1150 produces a high impedance output so that lead 108 is released and may be used for conducting handshake signals between the processor and other memory circuits. Thus, the phase modulated I/O circuit remains in a precharged state established by the most recent precharge signal PRC on lead 216.

Figure 3:
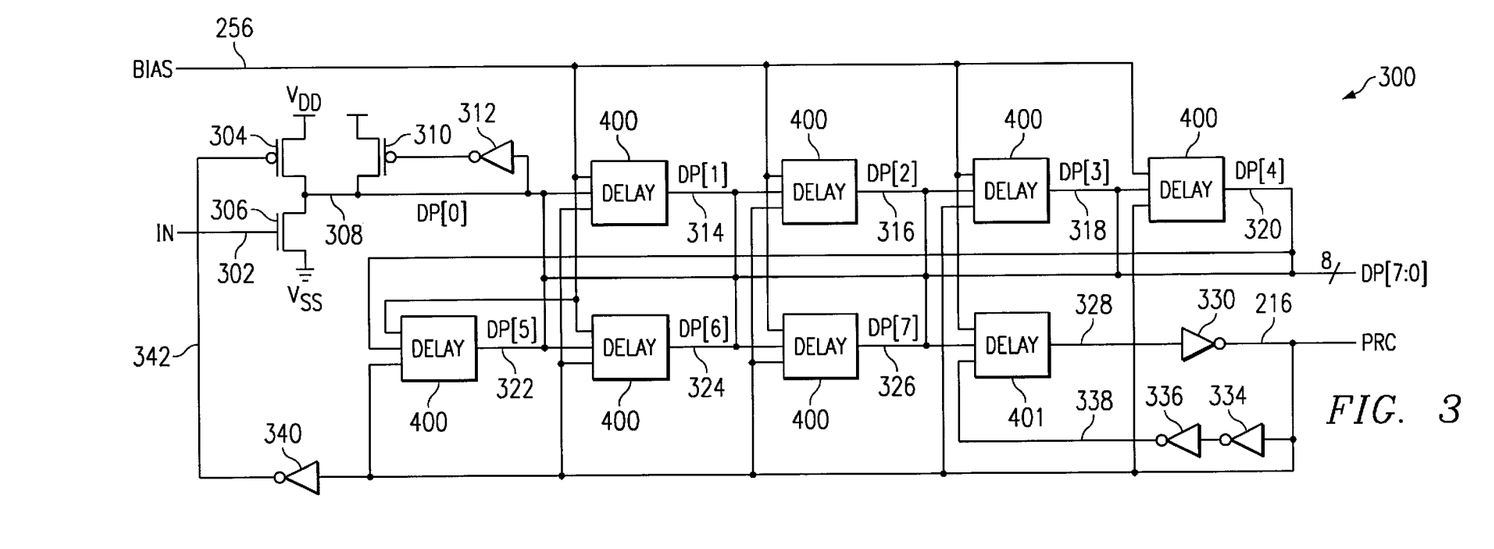
FIG. 3 is a schematic diagram of a variable delay circuit of the present invention.
Figure 4:
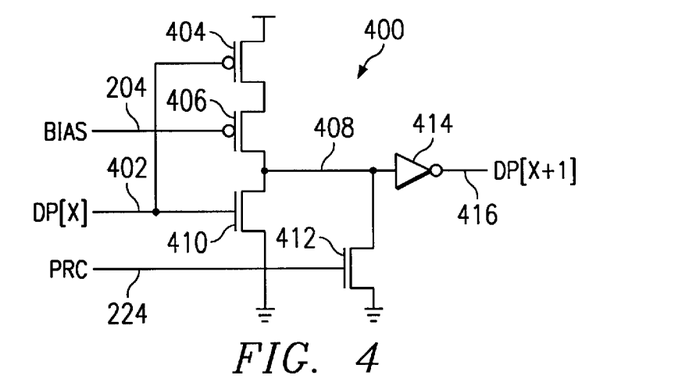
FIG. 4 is a schematic diagram of a delay stage of the delay circuit of FIG. 3.

Referring now to FIG. 3, operation of a variable delay circuit as used in phase generator 300 and clock divider 301 will be-explained in detail. The variable delay circuit includes an input stage and seven series-connected, variable delay stages 400 and an eighth delay stage 401 (FIG. 4). The input stage includes P-channel precharge transistor 304, N-channel input transistor 306 and a latch formed by inverter 312 and P-channel transistor 310. The P-channel transistor 310 remains on in a precharge state of the variable delay circuit and maintains a high level on lead 308, which is the output terminal for the first phase signal DP[0]. Phase signal DP[0] is applied to the first of seven identical delay stages 400, which produces phase signal DP[1] on lead 314. The series connection of each delay stage output to the next delay stage input continues to the input of delay stage 401 which receives the last phase signal DP[7] as an input. Delay stage 401 is the same circuit as delay stages 400, but provides an additional delay required for a minimum output pulse DQ width prior to returning the phase generator 300 to a precharge state.

The output signal from delay stage 401 on lead 328 initiates a precharge state of the phase modulated I/O circuit. Inverter 330 buffers this output signal to produce precharge signal PRC on lead 216. Precharge signal PRC is applied to phase decoder 600, phase encoder 900, output driver 1100 (FIG. 2) and to each of the variable delay stages 400 (FIG. 3). Precharge of variable delay stage 401 is delayed by inverters 334 and 334 to provide a sufficient pulse width for precharge signal PRC. Finally, precharge signal PRC is inverted by inverter 340 to produce an active low signal on lead 342. This active low signal turns on P-channel transistor 304 to restore lead 308 to a logic high precharge level.

Turning now to FIG. 4, operation of delay stage 400 will be described in detail. A first inverter stage of delay stage 400 includes series-connected P-channel transistors 404 and 406 and N-channel transistor 410. A level of BIAS at lead 204 determines the conductivity of P-channel transistor 406, and, therefore, the delay of the stage. A high-to-low transition of input phase signal DP[x] at lead 402, therefore, causes P-channel transistor 404 to turn on and charge lead 408 and the input capacitance of inverter 414 at a rate determined by this conductivity of P-channel transistor 406. The voltage on output lead 408 increases at this rate until the output of inverter 414, output phase signal DP[x+1], is driven low. The delay stage is restored to a precharge state, as previously described, by a high level of precharge signal PRC on lead 224. This high level turns on N-channel transistor 412, thereby causing a low level on lead 408 and a corresponding high level of output phase DP[x+1] on lead 416.

The circuit of clock divider circuit 301 (FIG. 2) is the same as phase generator 300 (FIG. 3). Since the clock divider circuit 301 and the phase generator circuit 300 both receive the same BIAS, both have the same delay. In operation, clock divider 301 receives clock signal CLK at the control gate of N-channel transistor 306. Thus, a low-to-high transition of clock signal CLK initiates the series of phase signals DP[0]–DP[7] in clock divider circuit 301. The output signal at lead 216, however, corresponds to precharge signal PRC' on lead 258 (FIG. 2). This precharge signal PRC' is applied to phase comparator circuit 500 for comparison with the phase of clock signal CLK on lead 112.

Figure 5A:
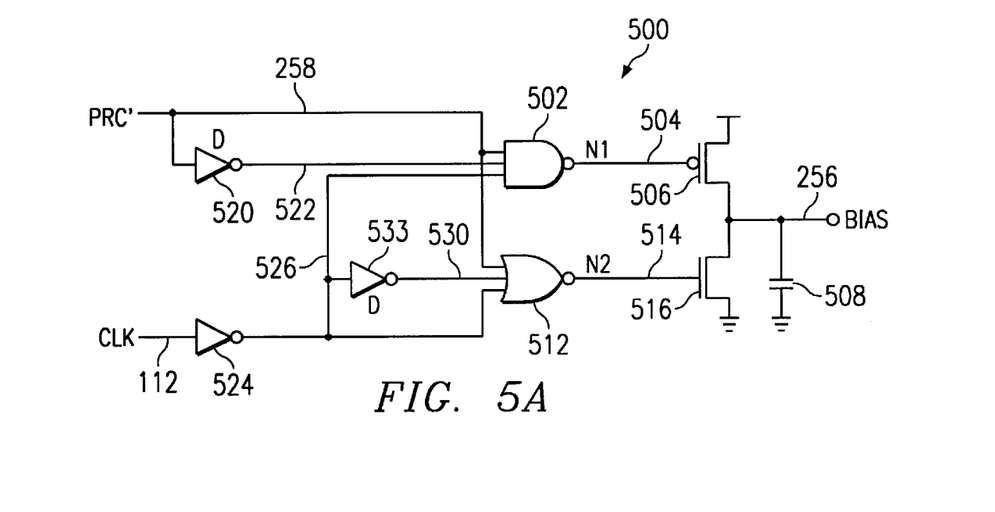
FIG. 5A is a schematic diagram of an embodiment of a phase comparator circuit that may be used with the phase modulated I/O circuit of the present invention.
Figure 5B:
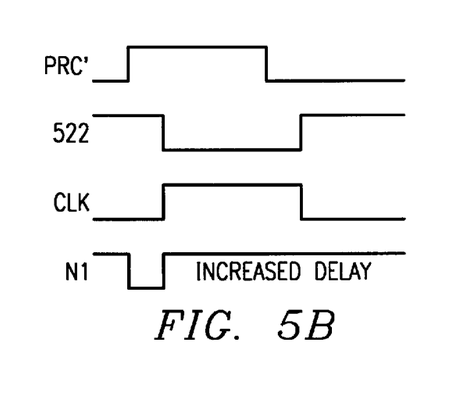
FIG. 5B is a timing diagram for the circuit of FIG. 5A showing increased delay.
Figure 5C:
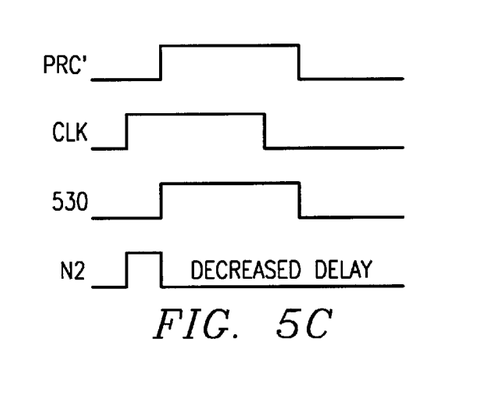
FIG. 5C is a timing diagram for the circuit of FIG. 5A showing decreased delay.

Referring now to FIGS. 5A–5C, operation of phase comparator circuit 500 will be explained in detail. Phase comparator circuit 500 receives and compares low-to-high transitions of clock signal CLK on lead 112 and precharge signal PRC' on lead 258. The precharge signal PRC' transition precedes the clock signal CLK transition (FIG. 5B) when the cumulative delay timne of clock divider circuit 301 is less than the period of clock signal CLK. The low-to-high transition of precharge signal PRC' disables NOR gate 512 so that N-channel transistor 516 remains off. High level input signals on leads 112, 522 and 526 drive the output of NAND gate 502 at lead Ni low, thereby turning on P-channel transistor 506. P-channel transistor 506 conducts to charge load capacitor 508. This charging of load capacitor 508 increases the level of BIAS until delay inverter 520 drives lead 522 low. This low level drives the signal on lead N1 high, turning off P-channel transistor 506. The resulting increase in the level of BLAS decreases the conductivity of P-channel transistor 406 in each variable delay stage 400–401 of clock divider circuit 301, thereby increasing the cumulative delay of the clock divider circuit 301 and the phase generator circuit 300.

Alternatively, the clock signal CLK transition precedes the precharge signal PRC' transition (FIG. 5C) when the cumulative delay time of clock divider circuit 301 is greater than the period of clock signal CLK. Inverter 524 produces a low level on lead 526, responsive to the low-to-high transition of clock signal CLK, that disables NAND gate 502 and drives the signal on lead N1 high. The resulting low level on all inputs of NOR gate 512 drives the output signal at lead N2 high, thereby turning on N-channel transistor 516. N-channel transistor 516 conducts to discharge load capacitor 508. This discharging decreases the level of BIAS until delay inverter 533 drives lead 530 high. This high level drives the signal on lead N2 low, turning off N-channel transistor 516. The resulting decrease in the level of BIAS increases the conductivity of P-channel transistor 406 in each variable delay stage 400–401 of clock divider circuit 301 and phase generator circuit 300, thereby decreasing the cumulative delay of precharge signal PRC'.

Figure 12:
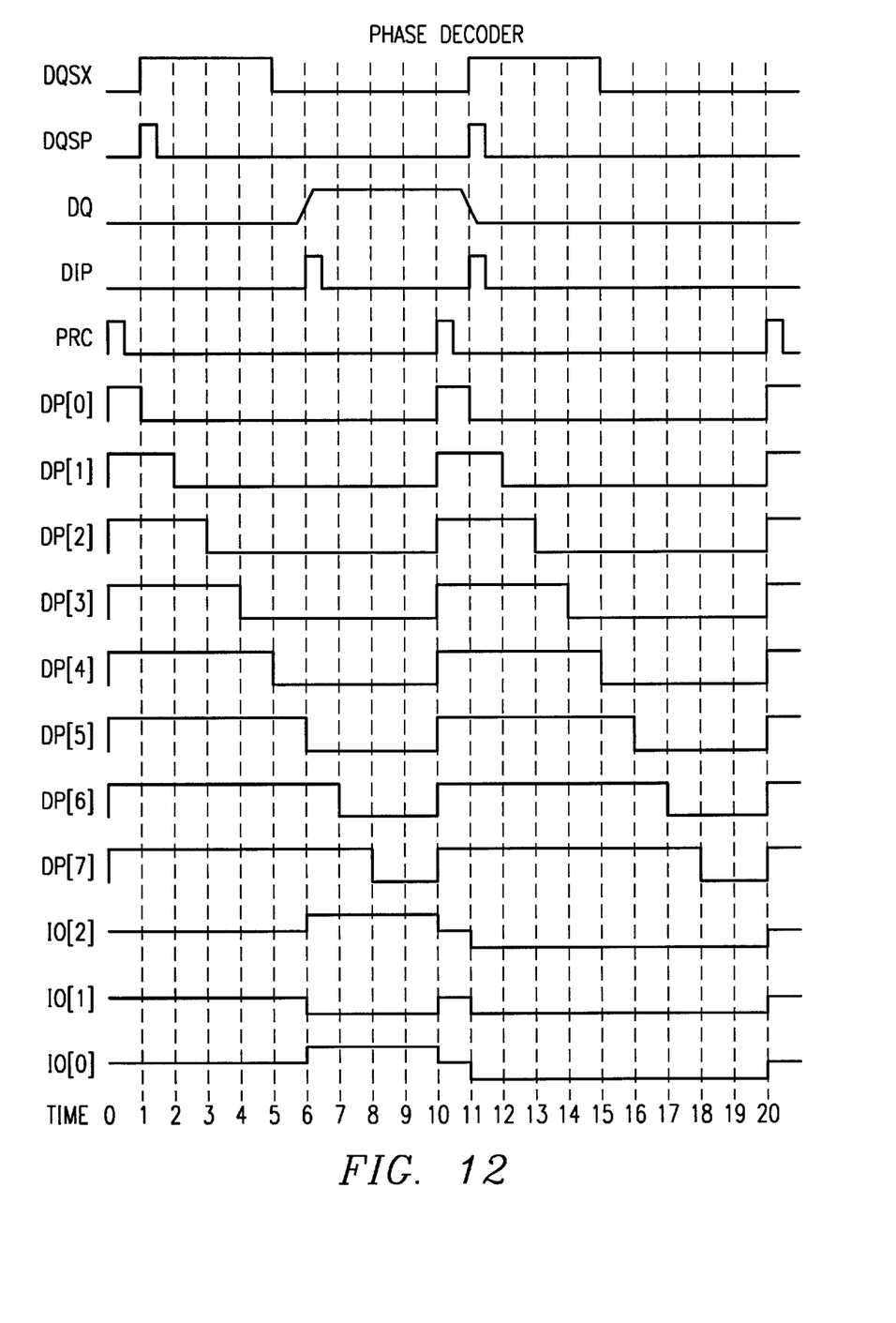
FIG. 12 is a timing diagram showing operation of the phase decoder circuit of the present invention.

A phase decoder circuit (FIG. 6) that may be used with the phase modulated I/O circuit of the present invention will be explained with reference to the timing diagram of FIG. 12. The phase decoder circuit 600 includes three phase select circuits 700 corresponding to each of IO[2:0]. Each phase select circuit is coupled to receive data input enable signal /DIEN, data input pulse signal DIP and output signal /P of a latch formed by cross-coupled NOR gates 670 and 672. Decoded phase input signals PI0, PI1 and P12 from phase decode circuits are applied to respective phase select circuits on leads 640, 672 and 684.

Figure 6:
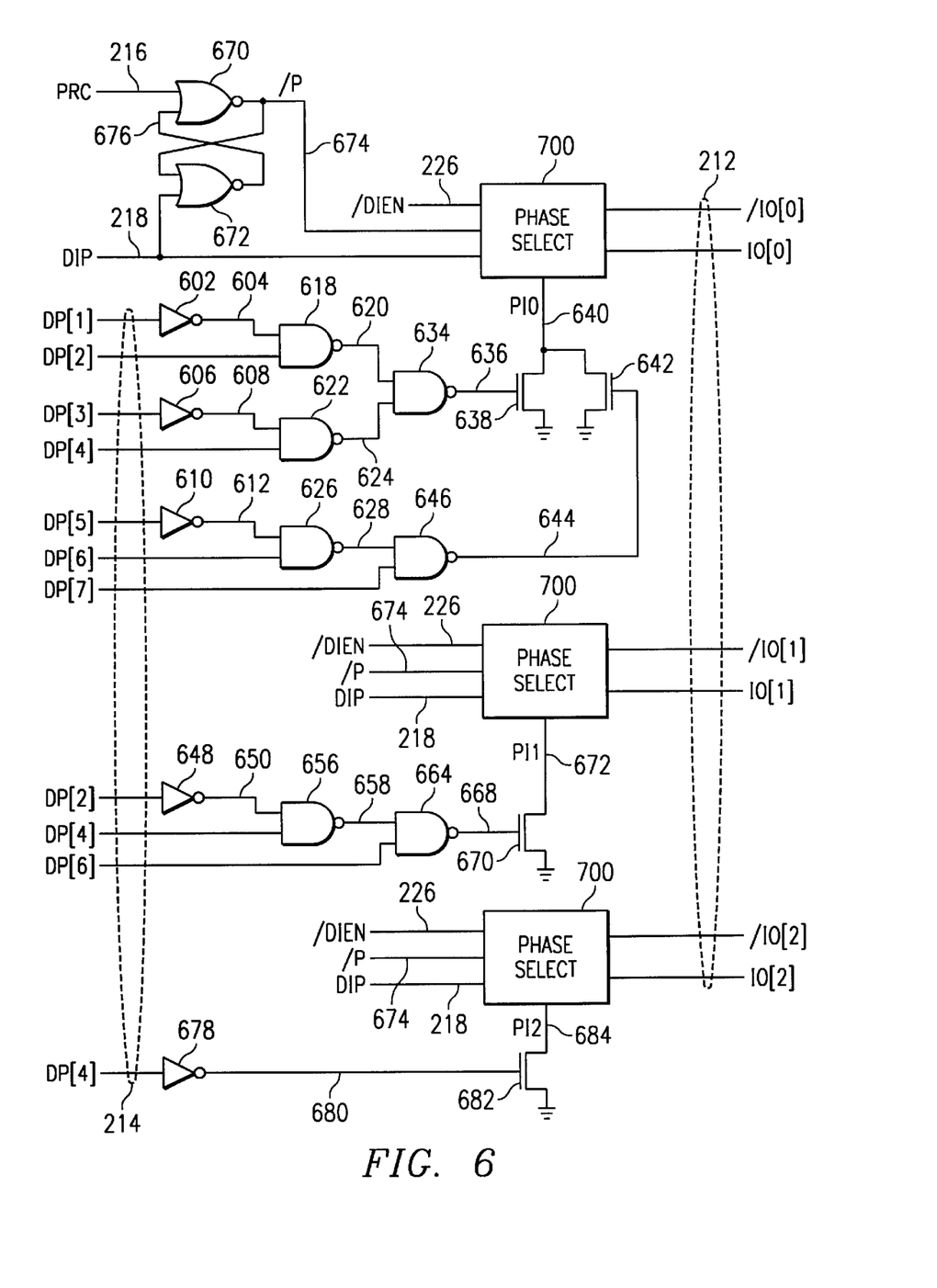
FIG. 6 is a schematic diagram of a phase decoder circuit that may be used with the phase modulated I/O circuit of the present invention.

In operation, phase decoder circuit 600 is initially reset to a precharge state at time 0 (FIG. 12) by precharge signal PRC on lead 216 when data input pulse DIP on lead 218 is low. The high level of precharge signal PRC drives signal /P at lead 674 low, thereby precharging each phase select circuit 700 as will be explained. Low input signals on NOR gate 672 latch signal /P on lead 674 high. External handshake signal DQSX produces handshake pulse DQSP at time 1. The handshake pulse DQSP initiates a series of active low data phase signals DP[7:0] corresponding to times 8-1, respectively. Each phase decode circuit produces a respective phase input signal, for example PI0, corresponding to the logic states of DP[7:1]. Encoded data signal DQ at time 6 produces data input pulse DIP. The phase select circuit, enabled by active low data input enable signal /DIEN, produces a high data signal IO[0] corresponding to low phase signals DP[5:1] and high phase signals DP[7:6] when data input pulse DIP goes high. In particular, the high /DP[5] on lead 612 and DP[6] produce a low output from NAND gate 626 on lead 628. This low signal on lead 628 produces a high output from NAND gate 646, thereby turning on N-channel transistor 642 and driving phase input signal PI0 low. Additionally, data signal IO[1] goes low, corresponding to the decoded state of data phase signals DP[2], DP[4] and DP[6], which produces a low signal on lead 668 causing phase input signal PI1 to remain high. Data signal IO[2] goes high, corresponding to the decoded state of data phase signal DP[4]. Thus, the decoded 101 logic state of data signals IO[2:0] on bus 212 is written to memory array 202 (FIG. 2) via column decode and I/O logic circuit 204.

Figure 7:
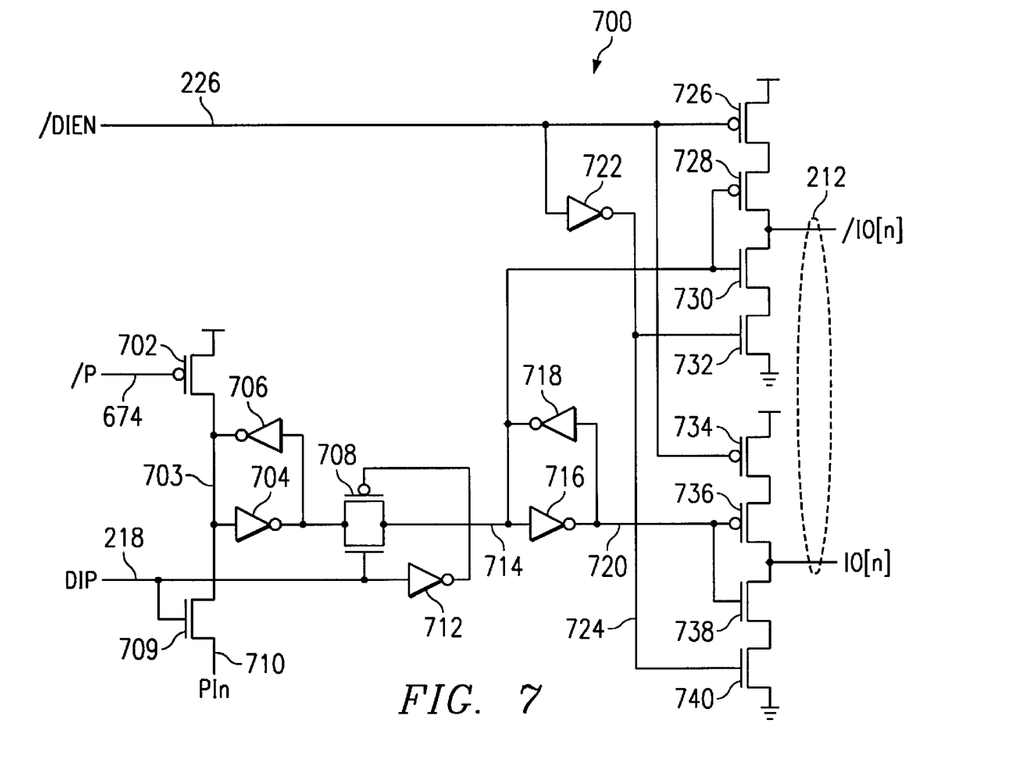
FIG. 7 is a schematic diagram of a phase select circuit that may be used with the phase decoder circuit of the present invention.

Turning now to FIG. 7, each phase select circuit 700 includes a switching circuit and two tristate drivers for producing each data signal /IO[n] and IO[n] on bus 212, where n may be 2-0. Lead 703 is initially precharged high by P-channel transistor 702 in response to a low level of signal /P on lead 674. A high level of data input enable signal /DIEN on lead 226 and the complement on lead 724 turn off P-channel transistors 726 and 734 and N-channel transistors 732 and 740. This maintains each output driver in a high impedance state. N-channel transistor 709 is initially off due to the low level of data input pulse DIP.

An active low level of data input enable signal /DIEN enables both tristate drivers corresponding to data signals /IO[n] and IO[n], respectively. A high level data input pulse DIP in response to a transition of encoded data signal DQ reverses the logic state of the latch formed by NOR gates 670 and 672 (FIG. 6) and drives signal /P high. This high state of signal /P turns off P-channel transistor 702. The latch formed by inverters 704 and 706, however, maintains a high level on lead 703.

Furthernore, the high level of data input pulse DIP turns on N-channel transistor 709 for a brief time to select the proper phase of respective data phase signals DP[7:0] as previously described. A low state of phase input signal Pin on lead 710 will override the latch formed by inverters 704 and 706, thereby driving the signal on lead 703 low through N-channel transistor 708. Data input pulse DIP simultaneously turns on CMOS gate 708, thereby transferring the signal on lead 703 to the latch formed by inverters 716 and 718 at lead 720. This low level on lead 720 produces a corresponding high level of data signal IO[n] while the high level on lead 714 produces a corresponding low level of data signal /IO[n]. Alternatively, a high level or high impedance state of phase signal PIn on lead 710 leaves lead 703 latched high, thereby producing a low level of data signal IO[n] and a high level of data signal /IO[n].

Figure 8:
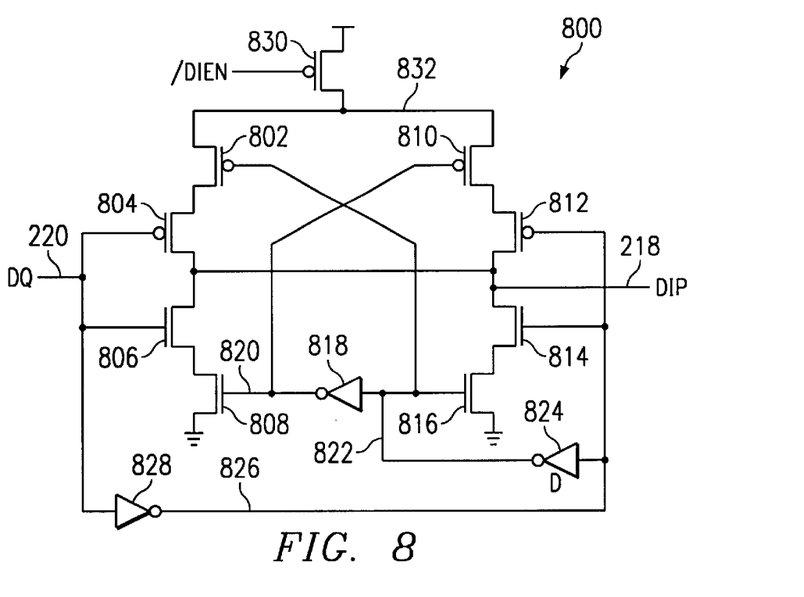
FIG. 8 is a schematic diagram of a data transition detector circuit that may be used with the phase modulated I/O circuit of the present invention.

The data transition detector circuit of FIG. 8 produces a short-duration, high level pulse DIP corresponding to each transition of the external encoded data signal DQ on lead 220. The data transition detector circuit 800 includes two CMOS tristate inverters sharing a common output lead 218. The first tristate inverter is formed by P-channel transistors 802 and 804 and N-channel transistors 806 and 808. The second tristate inverter is formed by P-channel transistors 810 and 812 and N-channel transistors 814 and 816. In operation, the data transition detector circuit is initially disabled by a high level of data input enable signal /DIEN.

The data transition detector circuit is enabled by an active low data input enable signal /DIEN on lead 228. The resulting high level on lead 832 enables the data transition detector circuit. If encoded data signal DQ is low, there is no change in the logic state of the circuit. A low-to-high transition of encoded data signal DQ turns off P-channel transistor 804 and turns on N-channel transistor 806. Inverter 828 subsequently produces a low level on lead 826 that turns on P-channel transistor 812 and turns off N-channel transistor 814. In this state, series-connected P-channel transistors 810 and 812 are on and drive data input pulse DIP high. After a short time, delay buffer 824 reproduces this low level on lead 822, thereby turning on P-channel transistor 802 and turning off N-channel transistor 816. Inverter 818 then produces a high level on lead 820 that turns off P-channel transistor 810. This high evel also turns on N-channel transistor 808, thereby completing a conduction path with N-channel transistor 806 and driving data input transition pulse DIP low again.

A subsequent high-to-low transition of encoded data signal DQ will drive data input pulse DIP high through series-connected P-channel transistors 802 and 804. Inverter 828 then produces a high level on lead 826 in response to the low level on lead 220, thereby turning off P-channel transistor 812 and turning on N-channel transistor 814. After a short timne, delay buffer 824 reproduces the high level of lead 826 on lead 822, thereby turning off P-channel transistor 802 and turning on N-channel transistor 816. This establishes a conduction path through N-channel transistors 814 and 816 and drives data input pulse DIP low again. The data transition detector circuit 800, therefore, continues to produce a pulse of short-duration determined by delay buffer 824 for each transition of encoded data signal DQ until data input enable signal /DIEN returns to an inactive high level.

Figure 9:
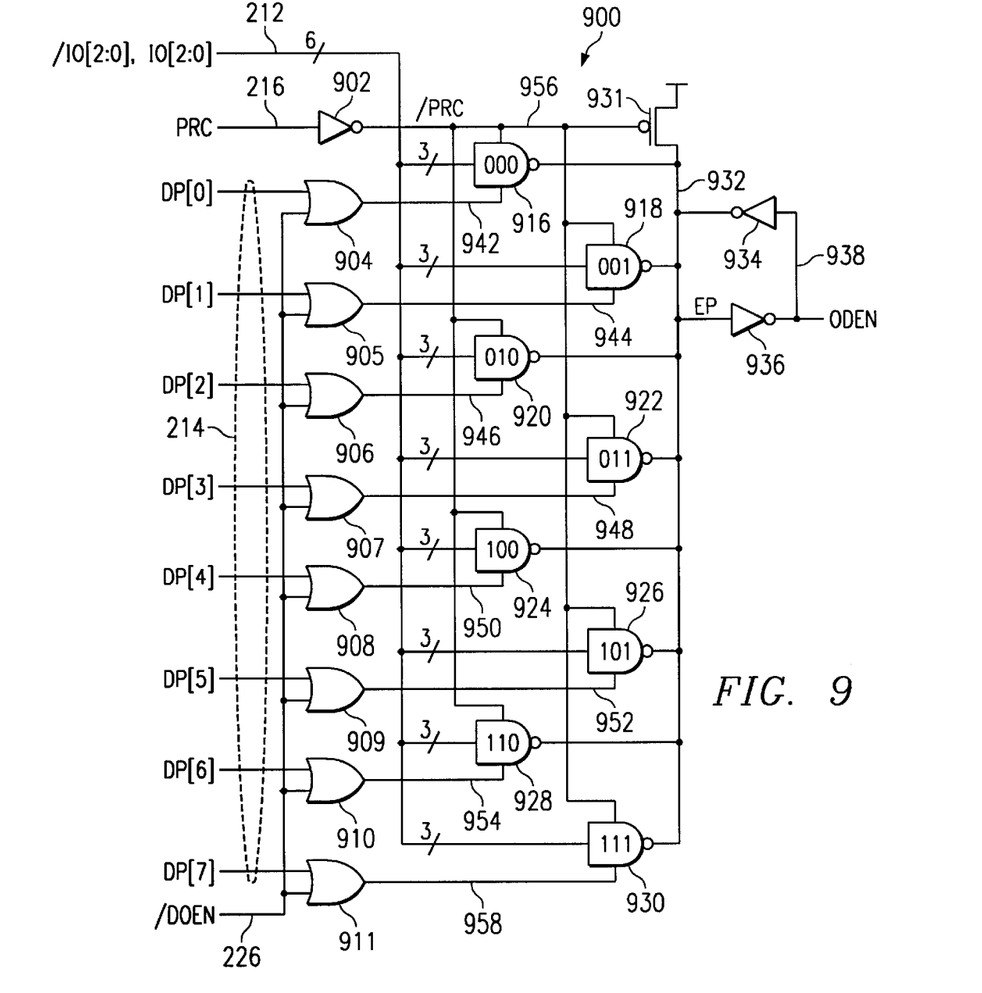
FIG. 9 is a schematic diagram of a phase encoder circuit that may be used with the phase modulated I/O circuit of the present invention.

Referring now to FIG. 9, there is a schematic diagram of a phase encoder circuit that may be used with the phase modulated I/O circuit of the present invention. The phase encoder circuit receives data input signals /IO[2:0] and IO[2:0] on bus 212 from memory array 202 via column decode and I/O circuit 204 (FIG. 2). The phase encoder circuit also receives the series of data phase signals DP[7:0] on bus 214 from phase generator circuit 300. The data phase signals are applied to respective prechargedischarge NAND gates 916–930 by respective OR gates 904–911. Each precharge-discharge NAND gate is programmed to receive true or complementary data input signals corresponding the unique data state indicated within the NAND gate symbol. The phase encoder circuit is initialized by precharge signal PRC on lead 216. Inverter 902 produces complementary precharge signal /PRC on lead 956 for precharging each of the precharge-discharge NAND gates 916–930. Complementary precharge signal /PRC also turns on P-channel transistor 931 which drives the common output signal EP on lead 932 high. Buffering inverter 936 inverts output signal EP to produce output data enable signal ODEN on lead 938. Inverter 934 in combination with buffering inverter 936 latches the high precharge level on lead 932.

Figure 10:
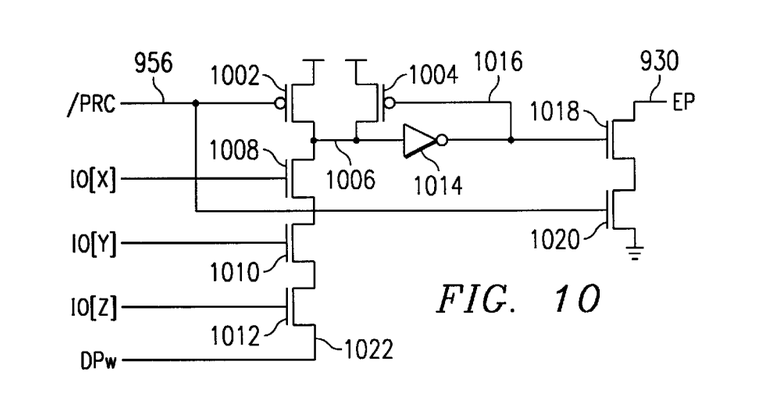
FIG. 10 is a schematic diagram of a NAND gate that may be used with the phase encoder circuit of the FIG. 9.

Each precharge-discharge NAND gate (FIG. 10) is the same except for programnming differences. For example, NAND gate 926, designated 101, receives data signals IO[2], /IO[1] and IO[0] corresponding to IO[x], IO[y] and IO[z], respectively. Moreover, data phase signal DP[5] is coupled to NAND gate 926 by lead 952, corresponding to data phase DPw on lead 1022 (FIG. 10). The signal on lead 1006 is latched high in precharge by inverter 1014 and P-channel transistor 1004. The open drain output section of the precharge-discharge NAND gate includes series-connected N-channel transistors 1018 and 1020.

Figure 13:
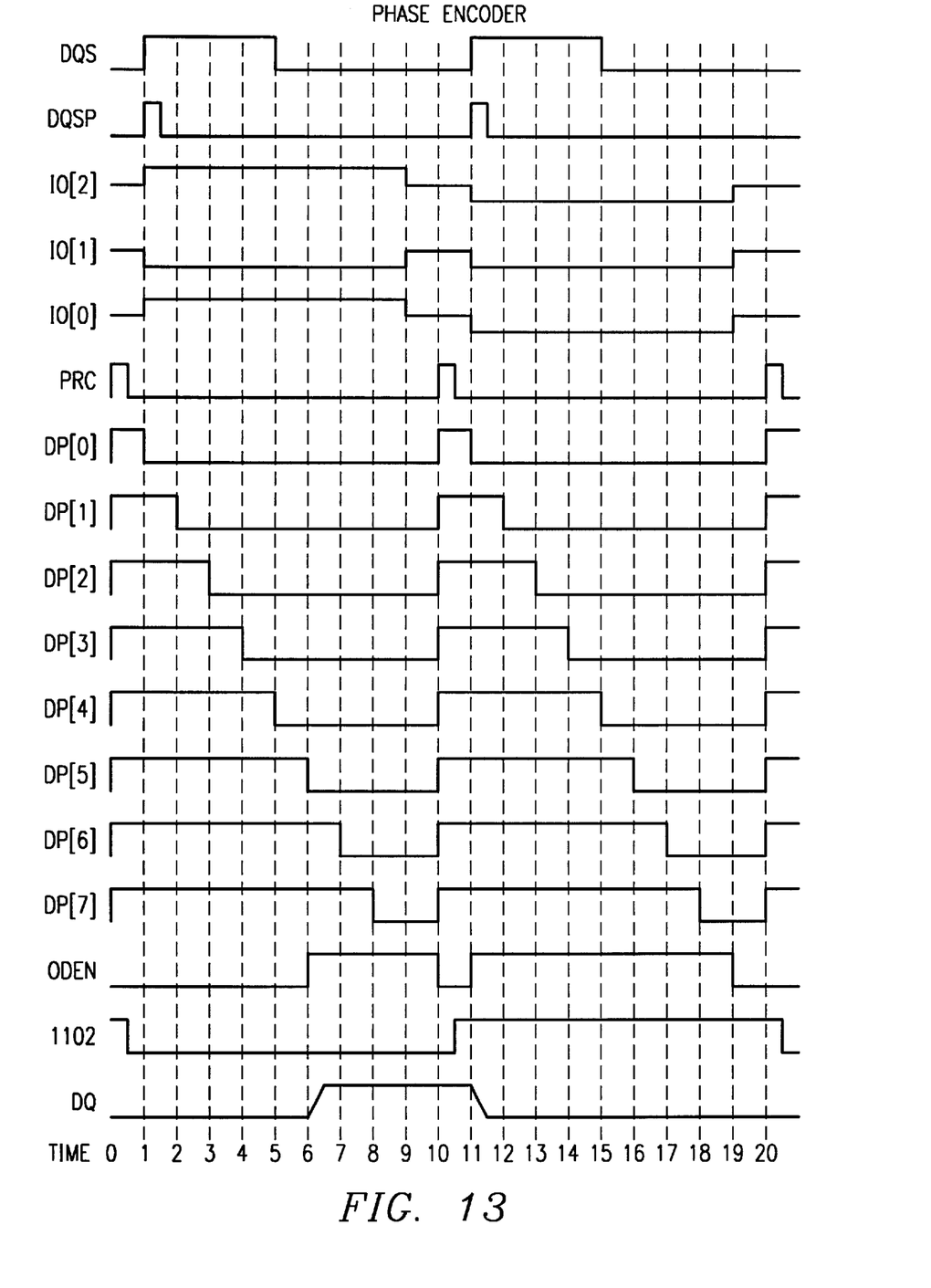
FIG. 13 is a timing diagram showing operation of the phase encoder circuit of the present invention.

Active operation of the phase encoder circuit, with reference to the timing diagram of FIG. 13, begins when an active low data output enable signal /DOEN on lead 226 (FIG. 2) couples internal handshake signal DQS to AND gate 240 to produce handshake pulse signal DQSP at time 1. This initiates the series of data phase signals DP[7:0] at times 8–1. This active low data output enable signal /DOEN also enables OR gates 904–911 (FIG. 9) to apply the series of data phase signals DP[7:0] to their respective precharge-discharge NAND gates 930–916. Only one of the eight precharge-discharge NAND gates will discharge according to the unique data signal programming. For example, data signals IO[2:0] at time 1 have a 101 logic state on bus 212 from three data bits of memory array 202. This logic state turns on each of series-connected N-channel transistors 1008, 1010 and 1012 (FIG. 10). Then, at time 6 (FIG. 13), data phase signal DP[5] goes low, thereby discharging a lead of NAND gate 926 corresponding to lead 1006 (FIG. 10). Inverter 1014 produces a high level signal that turns on N-channel transistor 1018. The resulting conductivity of series-connected N-channel transistors 1018 and 1020 overrides the latch formed by inverters 936 and 934, driving signal EP on lead 932 low. Inverter 936 (FIG. 9) inverts this low level to produce output data enable signal ODEN at time 6 (FIG. 13).

Figure 11A:
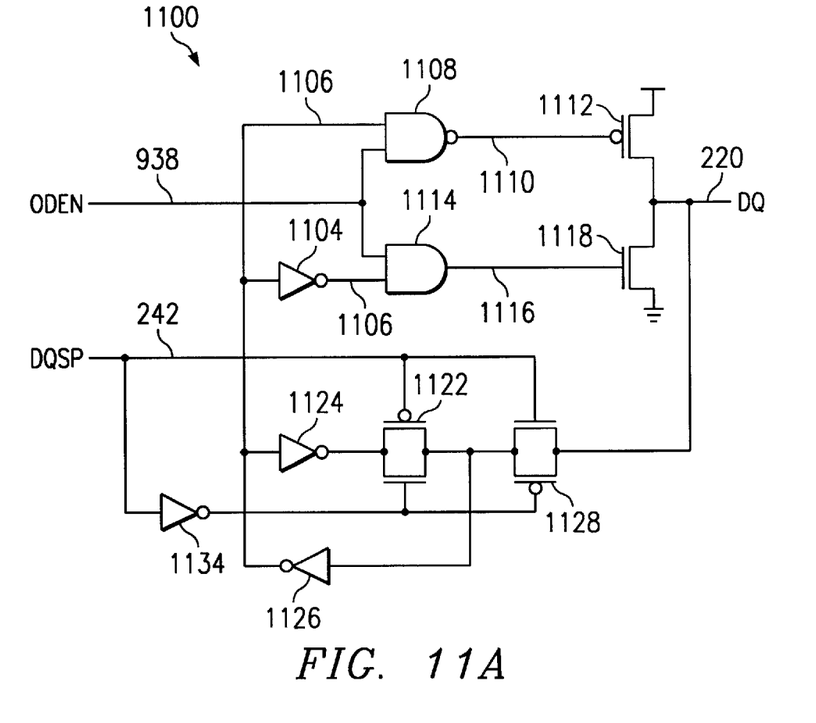
FIG. 11A is a schematic diagram of an output driver circuit that may be used with the phase modulated I/O circuit of the present invention.
Figure 11B:
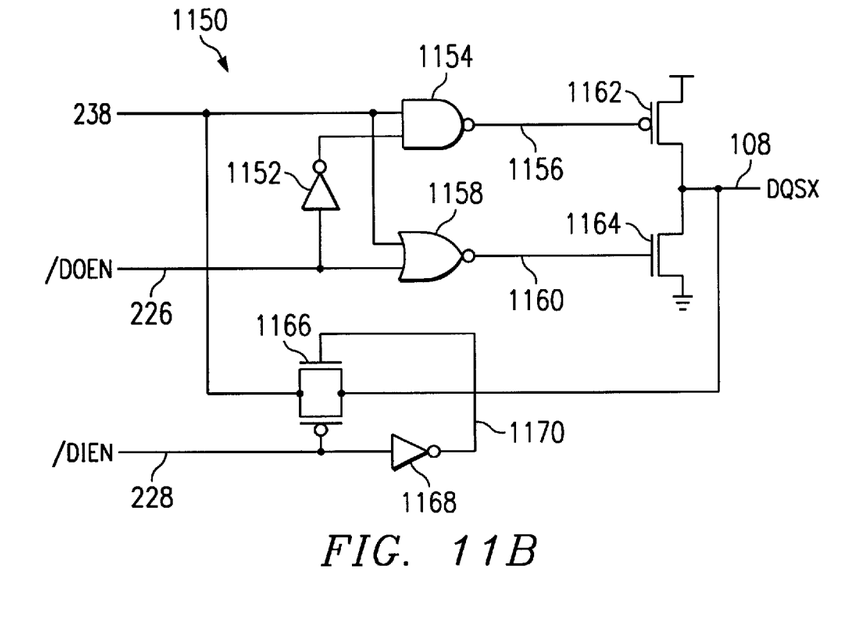
FIG. 11B is a schematic diagram of a handshake I/O circuit that may be used with the phase modulated I/O circuit of the present invention.

The output driver initially stores the next data level (after time 6) of encoded data signal DQ in a latch formed by inverters 1124 and 1126 at lead 1106 in response to handshake pulse signal DQSP on lead 242 (FIG. 11A). Output data enable signal ODEN is subsequently applied to output driver 1100. The high level of output data enable signal ODEN at time 6 enables NAND gate 1108 and AND gate 1114. These gates apply the data from lead 1106 to the control gates of P-channel transistor 1112 and N-channel transistor 1118. This low data level turns off N-channel transistor 1118 and turns on P-channel transistor 1112, thereby producing a high-level encoded data signal DQ at time 6.

The next memory read or load cycle begins at time 11 when handshake pulse signal DQSP goes high, thereby turning off CMOS gate 1122 and turning on CMOS gate 1128. Inverter 1126 then produces the complement of encoded data signal DQ at lead 1106. A subsequent low transition of handshake pulse signal DQSP turns on CMOS gate 1122 and turns off CMOS gate 1128, thereby latching the low signal on lead 1106. The low level of output data enable signal ODEN disables NAND gate 1108 and AND gate 1114 producing a high impedance output at lead 220. This low level signal is maintained on lead 1106 as the complement of the next data state after time 11. Thus, the output driver continues to produce alternating data states of encoded data signal DQ having an edge transition corresponding to a data state of three bits of memory from the memory array.

Although the invention has been described in detail with reference to its preferred embodiment, it is to be understood that this description is by way of example only and is not to be construed in a limiting sense. For example, a conventional 16-bit I/O memory circuit having a 12 nanoseconds (ns) clock period without phase modulation would have an effective data rate of 167 megabytes/second. By way of comparison, a preferred embodiment with a 12 ns clock period having each of eight data phases separated by 1 ns and a minimum output pulse width of 4 ns, would yield an effective data rate at one I/O terminal of 250 megabits/second. A 16-bit I/O device having 16 such I/O terminals would have an effective data rate of 500 megabytes/second. An alternative embodiment with 4 data bits and 16 data phases with 1 ns per phase and a 4 ns minimum pulse width, however, would have an effective data rate of 400 megabytes/second and operate with a clock period of 20 ns. Thus, a 40 percent reduction in the system clock frequency from 83.3 MHz to 50 MHz would still produce 80 percent of the effective data rate. Moreover, 4-bit compression produces 8 bytes of data for each clock cycle compared to 6 bytes for 3-bit compression.

Another embodiment of the present invention may be implemented to eliminate one of the delay stages 400 from each of phase generator 300 and clock divider 301. In this embodiment, a sequence of data phases 1–7 are applied to phase decoder 600 and phase encoder 900. Phase input logic (FIG. 6) is modified to produce a respective phase input signals Pin corresponding to a respective data input pulse signal DIP. Phase selection for phases 1–7 remains unchanged from the previous embodiment. If no phase is selected, however, data signals IO[2:0] remain low, corresponding to phase 0 and data state 000. A further simplification is realized in phase encoder circuit 900 (FIG. 9). Precharge-discharge NAND gate 916 and OR gate 904, corresponding to phase 0 and data state 000, may also be eliminated. Operation of phases 1–7 remains unchanged. Data state 000, however, fails to produce output date enable signal ODEN and a subsequent transition of encoded data signal DQ. This absence of a data transition is interpreted as the default 000 data state by a remote data encoder as previously described. Thus, the circuit functions as before with the default data state replacing phase 0 corresponding to data state 000. This simplification further enhances operation of the circuit by reducing the required number of clock divisions.

In yet another embodiment of the present invention may be implemented on a single integrated circuit. The consequent reduction in RLC parasitic values would halve the time required for each data phase and for the minimum pulse width. Moreover, the handshake signal might also be eliminated, as with small memory systems, by using the clock signal as a reference for read and write operations. Thus, the data rate on a single integrated circuit with 3-bit compression would double to 1 gigabyte/second.

In yet another embodiment, the present invention may be used to reduce required interconnect for address and control terminals. For example, twelve address bits may be transmitted simultaneously over a 4-lead bus using 3-bit compression. Thus, a significant reduction in layout area is possible with a phase modulated address data bus. Moreover, power consumption is greatly reduced by a signal transition on each of four address leads each cycle rather than on each of twelve address leads each cycle.

It is to be further understood that numerous changes in the details of the embodinents of the invention will be apparent to persons of ordinary skill in the art having reference to this description. It is contemplated that such changes and additional embodiments are within the spirit and true scope of the invention as claimed below.

What is claimed:

1. A circuit, comprising:
 a phase circuit coupled to receive a clock signal and a reference signal, the clock signal having a period, the phase circuit producing a series of phase signals within a time no greater than the period, each phase signal having a respective time after the reference signal; and a data output circuit, responsive to a plurality of data signals and at least one phase signal, the data output circuit producing an encoded data signal at a time corresponding to the respective time of the at least one phase signal.

2. A circuit as in claim 1, wherein the phase circuit comprises:

a clock divider circuit coupled to receive the clock signal and the bias, the clock divider circuit producing a clock delay signal;

a phase comparator circuit coupled to receive the clock signal and the clock delay signal, the phase comparator producing the bias; and a phase generator circuit coupled to receive the bias and the reference signal, the phase generator producing the series of phase signals.

3. A circuit as in claim 2, wherein the phase generator circuit produces a precharge signal, the precharge signal precharging the phase circuit at a time after a first series of phase signals and before a second series of phase signals.

4. A circuit as in claim 2, wherein the period is at least as great as the sum of a first time, for producing the series of phase signals, and a second time, for producing a minimum encoded data signal pulse width.

5. A circuit as in claim 1, wherein the data output circuit comprises:

a phase encoder circuit coupled to receive the plurality of data signals and the at least one phase signal, the phase encoder producing an enable signal at a time corresponding to the at least one phase signal; and an output driver circuit coupled to receive the enable signal, the output driver circuit producing the encoded data signal.

6. A circuit as in claim 5, wherein the output driver circuit produces an encoded data signal having alternating first and second logic states, a time of a transition between the first and second logic states corresponding to the at least one phase signal.

7. A circuit as in claim 6, wherein the phase circuit produces a precharge signal, the precharge signal precharging the phase encoder circuit at a time after a first series of phase signals and before a second series of phase signals.

8. A circuit as in claim 6, wherein the phase encoder circuit further comprises a plurality of logic gates, wherein each logic gate is selected by a logic state of each of the plurality of data signals and the at least one phase signal.

9. A circuit as in claim 1, wherein the phase circuit produces a series of $2^N$ phase signals corresponding to logic states of a plurality of N data signals.

10. A circuit as in claim 9, further comprising a control circuit, the control circuit producing the reference signal in synchronization with the series of $2^N$ phase signals and the plurality of N data signals.

11. A circuit, comprising:

a phase circuit coupled to receive a clock signal and a reference signal, the clock signal having a period, the phase circuit producing a series of phase signals within a time no greater than the period, each phase signal having a respective time after the reference signal; and a data input circuit coupled to receive an encoded data signal at a time corresponding to at least one of the phase signals, the data input circuit producing a plurality of data signals, responsive to the at least one phase signal and the encoded data signal at a time corresponding to the respective time of the at least one phase signal.

12. A circuit as in claim 11, wherein the phase circuit cornprises:

a clock divider circuit coupled to receive the clock signal and the bias, the clock divider circuit producing a clock delay signal;

a phase comparator circuit coupled to receive the clock signal and the clock delay signal, the phase comparator producing the bias; and a phase generator circuit coupled to receive the bias and the reference signal, the phase generator producing the series of phase signals.

13. A circuit as in claim 12, wherein the phase generator circuit produces a precharge signal, the precharge signal precharging the phase circuit at a time after the series of phase signals.

14. A circuit as in claim 11, wherein the data input circuit comprises:

a data transition detector circuit coupled to receive an encoded data signal, the data transition detector circuit producing a data transition signal corresponding to a time of a transition of the encoded data signal from a first logic state to a second logic state; and a phase decoder circuit coupled to receive the data transition signal and the at least one phase signal, the phase decoder producing a plurality of data signals at a time corresponding to the at least one phase signal.

15. A circuit as in claim 14, wherein the data transition signal is a pulse having a short duration.

16. A circuit as in claim 11, wherein the phase circuit produces a series of $2^N$ phase signals corresponding to logic states of a plurality of N data signals.

17. A circuit as in claim 16, wherein each of the plurality of N data signals is an address data signal.

18. A circuit, comprising:

a delay circuit coupled to receive a bias and a reference signal, the delay circuit producing a series of phase signals, the phase signals spaced apart in time in response to the bias, each phase signal having a respective time after the reference signal, each phase corresponding to logic states of a plurality of data signals;

an encoder circuit coupled to receive a first phase signal and a first plurality of data signals, the encoder circuit producing a first encoded data signal at a time corresponding to the respective time of the first phase signal; and a decoder circuit coupled to receive a second phase signal and a second encoded data signal corresponding to the respective time of the second phase signal, the decoder circuit producing a second plurality of data signals corresponding to the second phase signal.

19. A circuit as in claim 18, wherein the delay circuit comprises:

a divider circuit coupled to receive the reference signal and the bias, the divider circuit producing the series of phase signals and a reference delay signal; and a phase comparator circuit coupled to receive the reference signal and the reference delay signal, the phase comparator producing the bias.

20. A circuit as in claim 18, wherein the delay circuit produces a precharge signal, the precharge signal precharging the delay circuit at a time after the series of phase signals.

21. A circuit as in claim 18, further comprising a memory array, the memory array producing the first plurality of data signals during a memory read operation, the memory array receiving the second plurality of data signals during a memory write operation.

22. A circuit as in claim 18, wherein the encoder circuit and the decoder circuit are formed on a single integrated circuit, wherein the first encoded data signal produced by the encoder circuit is the same as the second encoded data signal received by the decoder circuit.

23. A circuit as in claim 18, wherein the encoder circuit is formed on a first integrated circuit and the decoder circuit is formed on second integrated circuit, wherein the first encoded data signal produced by the encoder circuit is the same as the second encoded data signal received by the decoder circuit, the first integrated circuit producing a reference signal corresponding to the first encoded data signal, the second integrated decoding the second encoded data signal in response to the reference signal.

24. A circuit as in claim 18, wherein the reference signal is a clock signal.

25. A circuit as in claim 18, wherein each of the first plurality of data signals is an address data signal and the first encoded data signal is an encoded address data signal.

* * * * *